United States Patent
Ewanchuk et al.

(10) Patent No.: US 10,886,871 B2
(45) Date of Patent: Jan. 5, 2021

(54) METHOD FOR CONTROLLING HEALTH OF MULTI-DIE POWER MODULE AND MULTI-DIE HEALTH MONITORING DEVICE

(71) Applicant: MITSUBISHI ELECTRIC CORPORATION, Tokyo (JP)

(72) Inventors: Jeffrey Ewanchuk, Rennes (FR); Julio Brandelero, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/480,606

(22) PCT Filed: Mar. 7, 2018

(86) PCT No.: PCT/JP2018/009831
§ 371 (c)(1),
(2) Date: Jul. 24, 2019

(87) PCT Pub. No.: WO2018/180474
PCT Pub. Date: Oct. 4, 2018

(65) Prior Publication Data
US 2020/0021235 A1 Jan. 16, 2020

(30) Foreign Application Priority Data
Mar. 31, 2017 (EP) .................. 17164258

(51) Int. Cl.
*H02H 3/00* (2006.01)
*H02P 29/68* (2016.01)
*G01R 31/26* (2020.01)
*G01R 31/28* (2006.01)
*G01R 31/40* (2020.01)

(52) U.S. Cl.
CPC .......... *H02P 29/68* (2016.02); *G01R 31/2608* (2013.01); *G01R 31/2817* (2013.01); *G01R 31/40* (2013.01)

(58) Field of Classification Search
CPC ............................. G01R 31/40; H02P 29/68
See application file for complete search history.

(56) References Cited

U.S. PATENT DOCUMENTS

2014/0133186 A1* 5/2014 Balakrishnan .......... H02M 3/00
363/17
2016/0377488 A1* 12/2016 Sjoroos .............. G01R 31/2642
374/163

* cited by examiner

*Primary Examiner* — Muhammad S Islam
(74) *Attorney, Agent, or Firm* — Birch, Stewart, Kolasch & Birch, LLP

(57) ABSTRACT

A multi-die health monitoring device:
sets, at a given current provided to the load by the group of dies, one of the dies in a non-conducting state (NCS),
obtains, when the die is in the NCS, a signal that is representative of the temperature of the die and determines the temperature of the die,
obtains, when the die is in the NCS, a signal that is representative of an on-state voltage (OSV) of the die and determines the OSV of the die,
retrieves in a table stored in a memory of the multi-die health monitoring device, an OSV that corresponds to the given current and the determined temperature of the die,
notifies that the multi-die power module has to be replaced, if the difference between the determined OSV of the die and the retrieved OSV is equal or upper than a predetermined value.

11 Claims, 7 Drawing Sheets

METHOD FOR CONTROLLING HEALTH OF MULTI-DIE POWER MODULE AND MULTI-DIE HEALTH MONITORING DEVICE

TECHNICAL FIELD

The present invention relates generally to a device and a method for controlling the health of a multi-die power module and a multi-die health monitoring device.

BACKGROUND ART

In the field of Power Electronics, some devices are known as vulnerable components, power modules are of them.

High power converter systems are composed of multi-die power modules in order to meet the demands of the load. Multi-die power modules are often found in uptime critical applications, i.e. mining or train traction drive systems, where regular replacement of the power components is done during maintenance in order to avoid downtown. In such multi-die power modules, measuring the state of health of the dies is difficult, as there is no opportunity to disrupt the load in order to perform measurements of various parameters.

The state of health of a power die like an IGBT is typically reflected in the deviation of the on-state voltage compared to the non-aged initial value. The on-state voltage is not only dependant of the age of the die, the on-state voltage also depends on the current and temperature. The correlation co-efficient between the on-state voltage and the temperature changes depends on the magnitude of current flowing through the die.

SUMMARY OF INVENTION

Technical Problem

The present invention aims to allow the determination of the health of dies of a multi-die power module that is reliable and simple to implement.

Solution to Problem

To that end, the present invention concerns a method for controlling the health of a multi-die power module comprising plural dies, a multi-die health monitoring device receiving an input signal and driving the dies of the multi-die power module, at least one group of dies of the multi-die power module providing current to a load, characterized in that the method is executed by the multi-die health monitoring device and comprises the steps of:
  setting, at a given current provided to the load by the group of dies, one die of the group of dies in a non-conducting state,
  obtaining, when the die is in the non-conducting state, a signal that is representative of the temperature of the die and determining the temperature of the die,
  obtaining, when the die is in the non-conducting state, a signal that is representative of an on-state voltage of the die and determining the on-state voltage value of the die,
  retrieving in a table stored in a memory of the multi-die health monitoring device, an on-state voltage that corresponds to the to the given current and the determined temperature of the die,
  notifying that the multi-die power module has to be replaced, if the difference between the determined on-state voltage value of the die and the retrieved on-state voltage is upper than a predetermined value.

The present invention concerns also a multi-die health monitoring device for controlling the health of a multi-die power module comprising plural dies, the multi-die health monitoring device receiving an input signal and driving the dies of the multi-die power module, at least one group of dies of the multi-die power module providing current to a load, characterized in that the multi-die health monitoring device comprises:
  means for setting, at a given current provided to the load by the group of dies, one die of the group of dies in a non-conducting state,
  means for obtaining, when the die is in the non-conducting state, a signal that is representative of the temperature of the die and for determining the temperature of the die,
  means for obtaining, when the die is in the non-conducting state, a signal that is representative of an on-state voltage of the die and for determining the on-state voltage value of the die,
  means for retrieving in a table stored in a memory of the multi-die health monitoring device, an on-state voltage that corresponds to the given current and the determined temperature of the die,
  means for notifying that the multi-die power module has to be replaced, if the difference between the determined on-state voltage value of the die and the retrieved on-state voltage is upper than a predetermined value.

Thus, the state of health of a multi-die power module is actively monitored during the power module operation without any additional sensor making the preventive maintenance easier.

According to a particular feature, the predetermined value is equal to twenty percent of the retrieved on-state voltage.

Thus, the power module may be replaced before the faults appear, avoiding catastrophic faults caused by the wear-out.

According to a particular feature, the signal that is representative of the temperature of the die and the signal that is representative of the on-state voltage of the die are obtained by providing a current to the gate of the die.

Thus, only one circuit is necessary to acquire the temperature of one die and the on-state voltage which can be easily integrated into gate drivers for multi-die power modules reducing the costs. Furthermore, no access to the multi-die power module package or to the power terminals of said multi-die power module device is necessary. Consequently, the design of a power converter is not modified.

According to a particular feature, the signal that is representative of the temperature of the die is obtained from a measurement of an internal gate resistor value of the die during a first predetermined time duration and the signal that is representative of the on-state voltage of the die is obtained from a measurement of an equivalent capacitor value of the die during a second time period following the first time period.

Thus, the temperature of the die is obtained independently of the loading conditions and the on-state voltage is directly correlated to the junction temperature, avoiding complex calibration methods deticated to de-coupling the interpendencies of the on-state voltage and the die temperature.

According to a particular feature, the method is executed sequencially for each die of the group of dies.

Thus, the state of health of each die of the group of dies are monitored at the same instance in each fundamental electrical cycle and a same measurement circuit may be shared by each die of the group of dies reducing the costs.

According to a particular feature, the multi-die power module comprises plural dies and the method is executed for each group of dies.

Thus, the state of health of the power module is monitored always in the same operating point of each group of dies regarding the load conditions, avoiding complex calculations. Furthermore, the state of health can be updated independently of the number of dies in each group.

According to a particular feature, the given current value is comprised between +/−15 percents of the peak current value provided to the load.

Thus, the impact of measuring the state of health of one die is minimized and the operating point of the power module is not modified. The characteristics of the invention will emerge more clearly from a reading of the following description of example embodiments, the said description being produced with reference to the accompanying drawings.

DESCRIPTION OF EMBODIMENTS

Figure 1:
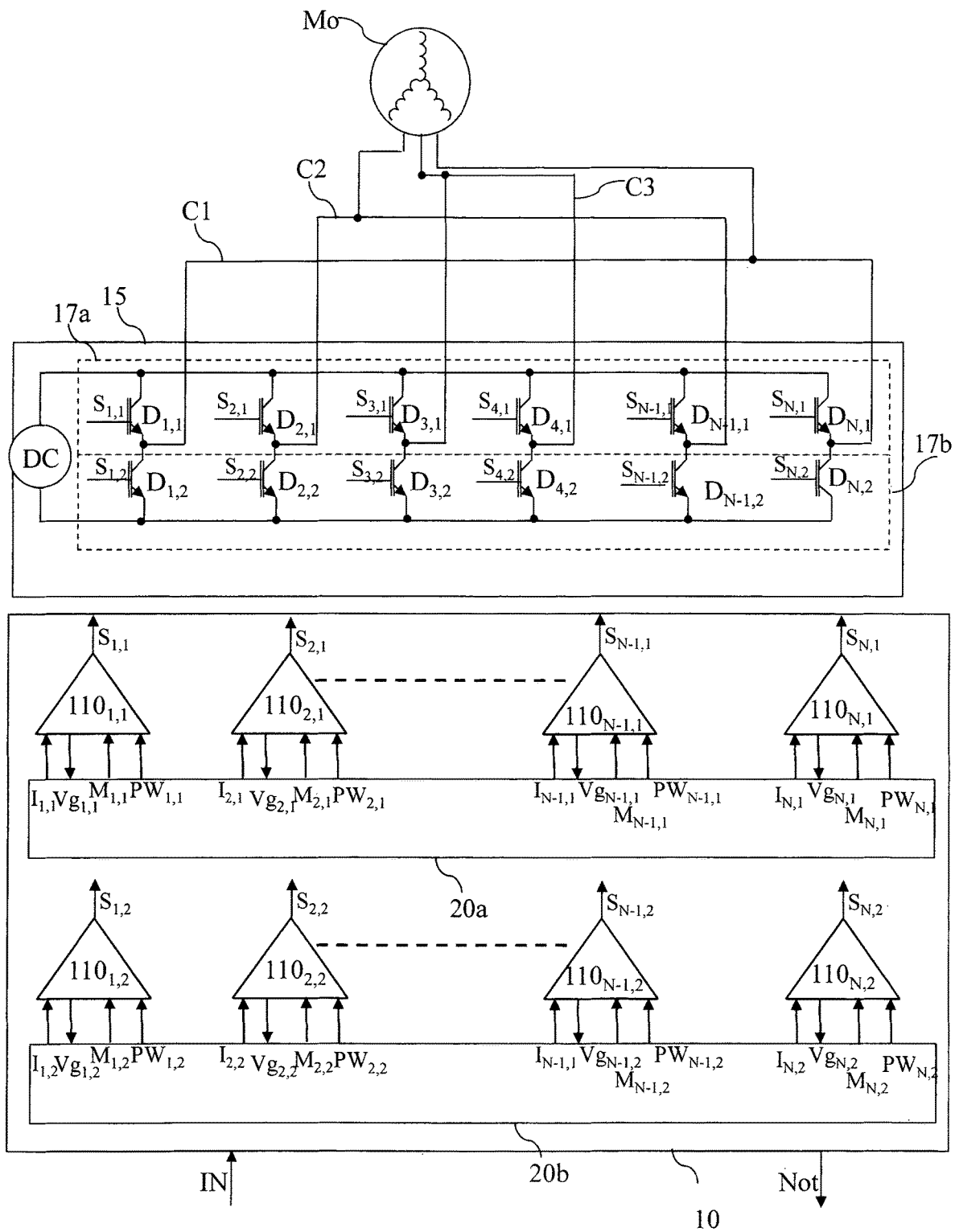
FIG. 1 represents an example of a system comprising a multi-die power module and a multi-die health monitoring device according to the present invention.

FIG. 1 represents an example of a system comprising a multi-die power module and a multi-die health monitoring device according to the present invention.

The multi-die power module 15 comprises 2*N dies noted $D_{1,1}$, $D_{1,2}$ to $D_{N,1}$ to $D_{N,2}$.

The multi-die health monitoring device 10 receives an input signal IN and drives the dies $D_{1,1}$, $D_{1,2}$ to $D_{N,1}$ to $D_{N,2}$ through respective amplifiers $110_{1,1}$, $110_{1,2}$ to $110_{N,1}$ to $110_{N,2}$. The amplifiers $110_{1,1}$, $110_{1,2}$ to $110_{N,1}$ to $110_{N,2}$ further comprise die temperature and on-state voltage sensing means.

The multi-die power module 15 comprises two groups of dies noted 17a and 17b. The first group of dies 17a comprises the dies $D_{1,1}$ to $D_{N,1}$. The second group of dies 17b comprises the dies $D_{1,2}$ to $D_{N,2}$. The collectors of the dies $D_{1,1}$ to $D_{N,1}$ are connected in parallel to a positive terminal of a power supply DC and the emitters of the dies $D_{1,1}$ to $D_{N,1}$ are connected respectively to the collectors of the dies $D_{1,2}$ to $D_{N,2}$. The emitters of the dies $D_{1,2}$ to $D_{N,2}$ are connected in parallel to a negative terminal of the power supply DC. The dies $D_{1,1}$, $D_{1,2}$ to $D_{N,1}$ to $D_{N,2}$ provide power to a load Mo. The load Mo is in the example of FIG. 1 a motor and signals C1, C2 and C3 provide electric power to the motor Mo.

For each die $D_{1,1}$, $D_{1,2}$ to $D_{N,1}$ to $D_{N,2}$, a diode, not shown in FIG. 1 for the sake of clarity, is connected between the emitter and the collector of the die. More precisely, the anode of the diode is connected to the emitter of the die and the cathode of the diode is connected to the collector of the die.

According to the present invention, a signal representative of the temperature and a signal representative of the on-state voltage of a die are determined in a single pulse width modulation cycle by injecting a current to the gate of the die when the die is in a non conductiong state. The signal representative of the temperature and the signal representative of the on-state voltage of the die, determined at a given current value of the signal provided to the load, are used to determine the health of the die.

The signal representative of the temperature and the signal representative of the on-state voltage of the die are derived according to an internal gate resistance measurement technique.

The internal gate resistance R of a die can be approximated as $R=a*T+b$ where a and b are constants, $b \gg a$ and T is the temperature of the die.

The multi-die health monitoring device 10 provides respectively a current $I_{1,1}$, $I_{1,2}$ to $I_{N,1}$ to $I_{N,2}$ to each amplifier that comprise die temperature sensing means and on-state voltage sensing means.

The multi-die health monitoring device 10 activates sequentially the injection of a current in the gate of the dies $D_{1,1}$, $D_{1,2}$ to $D_{N,1}$ to $D_{N,2}$ with the measurement signals $M_{1,1}$, $M_{1,2}$ to $M_{N,1}$ to $M_{N,2}$.

The first health monitoring module 20a provides to the amplifiers including temperature sensing means and on-state voltage $110_{1,1}$ to $110_{N,1}$ a pulse width modulated signal $PW_{1,1}$ to $PW_{N,1}$, measurement signals $M_{1,1}$ to $M_{N,1}$. The amplifiers including temperature sensing means and on-state voltage $110_{1,1}$ to $110_{N,1}$ provide signals $S_{1,1}$ to $S_{N,1}$ to the dies $D_{1,1}$ to $D_{N,1}$. The first health monitoring module 20a receives signals $Vg_{1,1}$ to $Vg_{N,1}$ representative of the temperature of the dies $D_{1,1}$ to $D_{N,1}$ and representative of the on state voltage of the dies $D_{1,1}$ to $D_{N,1}$.

The first health monitoring module 20a comprises an analogue to digital converter that is triggered at two predetermined instants in order to sample the signals $Vg_{1,1}$ to $Vg_{N,1}$.

The second health monitoring module 20b provides to the amplifiers including temperature sensing means and on-state voltage $110_{1,2}$ to $110_{N,2}$ a pulse width modulated signal $PW_{1,2}$ to $PW_{N,2}$, measurement signals $M_{1,2}$ to $M_{N,2}$. The amplifiers including temperature sensing means and on-state voltage $110_{1,2}$ to $110_{N,2}$ provide signals $S_{1,2}$ to $S_{N,2}$ to the dies $D_{1,2}$ to $D_{N,2}$.

The second health monitoring module 20b receives signals $Vg_{1,2}$ to $Vg_{N,2}$ representative of the temperature of the dies $D_{1,2}$ to $D_{N,2}$ and representative of the on state voltage of the dies $D_{1,2}$ to $D_{N,2}$.

The first health monitoring module 20b comprises an analogue to digital converter that is triggered at two predetermined instants in order to sample the signals $Vg_{1,2}$ to $Vg_{N,2}$.

The multi-die health device 10 comprises notification means Not in order to indicate that the multi-die power module has to be replaced.

According to the invention, the multi-die health monitoring device:
- sets, at a given current provided to the load by the group of dies, one die of the group of dies in a non-conducting state,
- obtains, when the die is in the non-conducting state, a signal that is representative of the temperature of the die and determines the temperature of the die,
- obtains, when the die is in the non-conducting state, a signal that is representative of an on-state voltage of the die and determines the on-state voltage value of the die,
- retrieves in a table stored in a memory of the multi-die health monitoring device, an on-state voltage that corresponds to the to the given current and the determined temperature of the die,
- notifies that the multi-die power module has to be replaced, if the difference between the determined on-state voltage value of the die and the retrieved on-state voltage is upper than a predetermined value.

Figure 2:
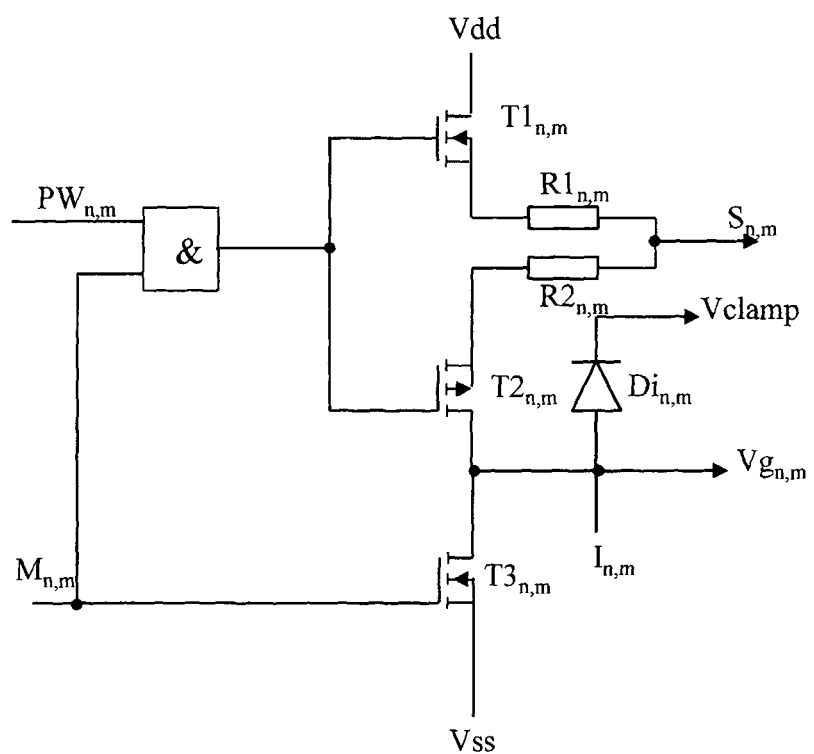
FIG. 2 represents an example of an amplifier including temperature sensing means and on-state voltage sensing means of a power die according to the present invention.

FIG. 2 represents an example of an amplifier including temperature and on-state voltage sensing means of a power die according to the present invention.

The pulse width modulated signal $PW_{n,m}$ received by the amplifier including temperature and on state voltage sensing means $110_{n,m}$ with n=1 to N and m=1 to 2 is provided to a first input of an And logic gate &.

The measurement signal $M_{n,m}$ received by the amplifier including temperature and on-state voltage sensing means 110d with n=1 to N and m=1 to 2 is provided to the second input of the And logic gate &.

The output of the And logic gate & is provided to the gates of transistors $T1_{n,m}$ and $T2_{n,m}$.

The drain of the transistor $T1_{n,m}$ is connected to a positive power supply Vdd, the source of the transistor $T1_{n,m}$ is connected to a first terminal of a resistor $R1_{n,m}$. A second terminal of the resistor $R1_{n,m}$ is connected to the gate of the die $D_{n,m}$.

The source of the transistor $T2_{n,m}$ is connected to a first terminal of a resistor $R2_{n,m}$. A second terminal of the resistor $R2_{n,m}$ is connected to the gate of the die $D_{n,m}$ and provides a signal $S_{n,m}$.

The drain of the transistor $T2_{n,m}$ is connected to the drain of a transistor $T3_{n,m}$ and to an anode of a diode $Di_{n,m}$. The voltage $Vg_{n,m}$ is dependent of the internal gate resistor value of the die $D_{n,m}$ that varies within a first time period according to the temperature of the die $D_{n,m}$ and varies within a second time period following the first time period according to the on-state voltage of the die $D_{n,m}$.

The source of the transistor $T3_{n,m}$ is connected to a negative power supply Vss.

The signal $M_{n,m}$ which activates the measurement of the die $D_{n,m}$ temperature and on-state voltage is provided to the gate of the transistor $T3_{n,m}$.

The current $I_{n,m}$ provided to the amplifier including temperature and on-state voltage sensing means $110_{n,m}$ is provided to the anode of the diode $Di_{n,m}$.

The cathode of the diode $Di_{n,m}$ is connected to a voltage Vclamp, which limits the voltage $Vg_{n,m}$. The voltage $Vg_{n,m}$ is provided to the input of the analogue to digital converter that is comprised in the I/O interface of the multi-die health monitoring device 10.

Figure 3A:
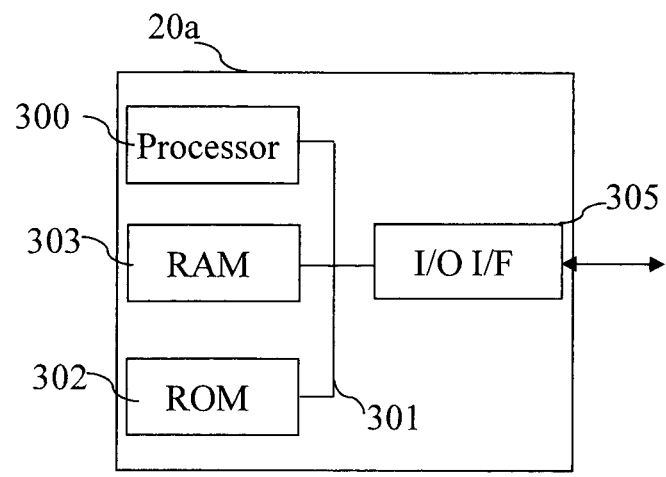
FIG. 3a represents an example of an architecture of a first part of the multi-die health monitoring device according to the present invention.

FIG. 3a represents an example of an architecture of a first part of the multi-die health monitoring device according to the present invention.

The first part of the multi-die health monitoring device 10 is the first health monitoring module 20a.

Figure 8:
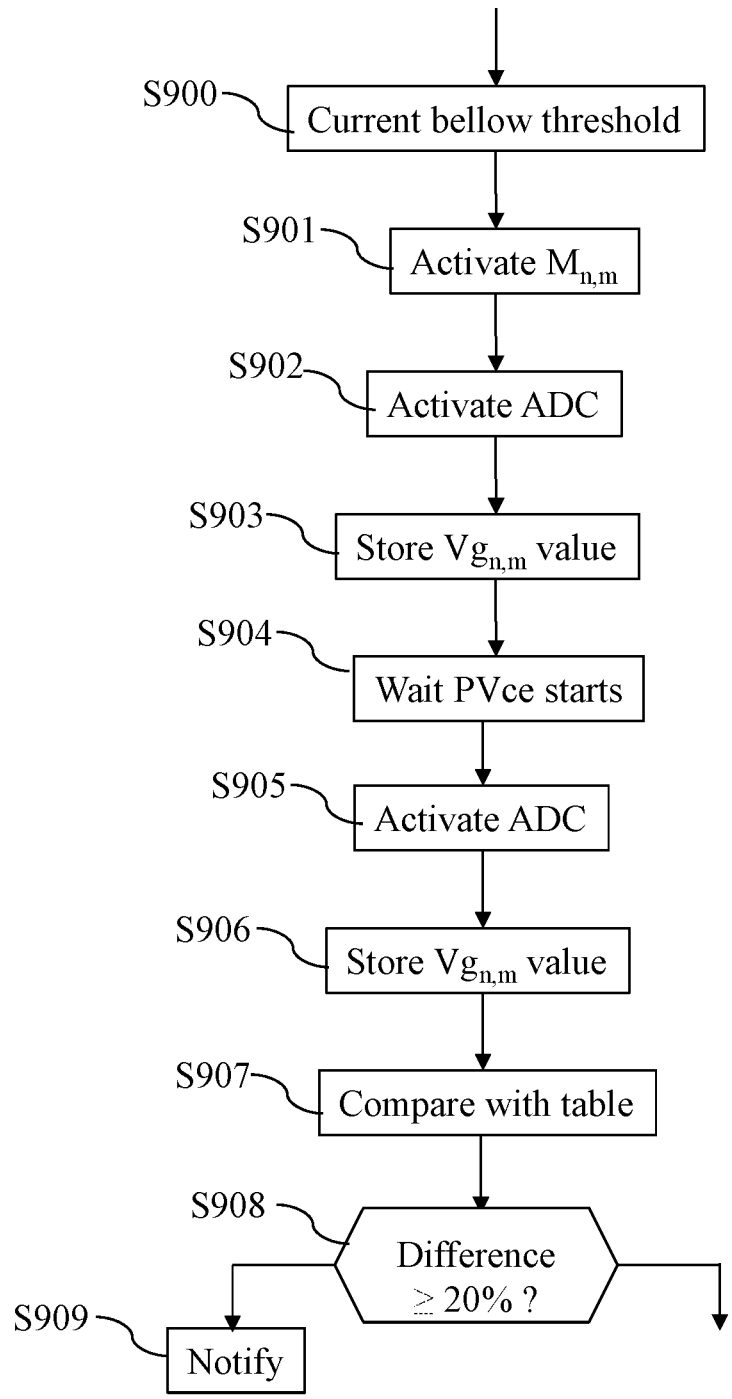
FIG. 8 represents an example of an algorithm for determining the temperature and the health of one die according to the present invention.

The first health monitoring module 20a has, for example, an architecture based on components connected together by a bus 301 and a processor 300 controlled by a program as disclosed in FIG. 8.

The bus 301 links the processor 300 to a read only memory ROM 302, a random access memory RAM 303 and an input output I/O IF interface 305.

The memory 303 contains registers intended to receive variables and the instructions of the program related to the algorithm as disclosed in FIG. 8.

The processor 300 receives through the input output I/O IF 305 voltages $Vg_{n,m}$ of the dies $D_{n,m}$ with n=1 to N and m=1, an input signal IN and outputs the pulse width modulated signals $Pw_{n,m}$ of the dies $D_{n,m}$ with n=1 to N and m=1, the measurement signal $M_{n,m}$ with n=1 to N and m=1 and the current $I_{n,m}$ with n=1 to N and m=1.

The read-only memory, or possibly a Flash memory 302, contains instructions of the program related to the algorithm as disclosed in FIG. 8, when the first health monitoring module 20a is powered on, to the random access memory 303.

The first health monitoring module 20a may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the first health monitoring module 20a includes circuitry, or a device including circuitry, enabling the first health monitoring module 20a to perform the program related to the algorithm as disclosed in FIG. 8.

Figure 3B:
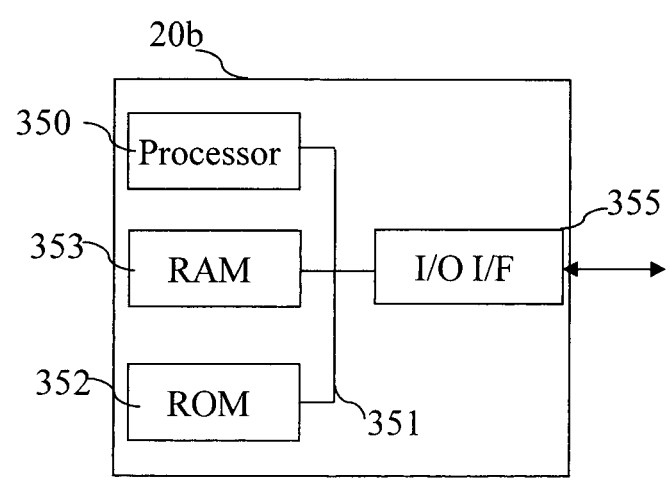
FIG. 3b represents an example of an architecture of a second part of the multi-die health monitoring device according to the present invention.

FIG. 3b represents an example of an architecture of a second part of the multi-die health monitoring device according to the present invention.

The second part of the multi-die health monitoring device 10 is the second health monitoring module 20b.

The second health monitoring module 20b has, for example, an architecture based on components connected together by a bus 351 and a processor 350 controlled by a program as disclosed in FIG. 8.

The bus 351 links the processor 350 to a read only memory ROM 352, a random access memory RAM 353 and an input output I/O IF interface 355.

The memory 353 contains registers intended to receive variables and the instructions of the program related to the algorithm as disclosed in FIG. 8.

The processor 350 receives through the input output I/O IF 355 voltages $Vg_{n,m}$ of the dies $D_{n,m}$ with n=1 to N and m=2, an input signal IN and outputs the pulse width modulated signals $Pw_{n,m}$ of the dies $D_{n,m}$ with n=1 to N and m=2, the measurement signal $M_{n,m}$ with n=1 to N and m=2 and the current $I_{n,m}$ with n=1 to N and m=2.

The read-only memory, or possibly a Flash memory, contains instructions of the program related to the algorithm as disclosed in FIG. 8, when the second health monitoring module 20b is powered on, to the random access memory 353.

The second health monitoring module 20b may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the second health monitoring module 20b includes circuitry, or a device including circuitry, enabling the second health monitoring module 20b to perform the program related to the algorithm as disclosed in FIG. 8.

Figure 4:
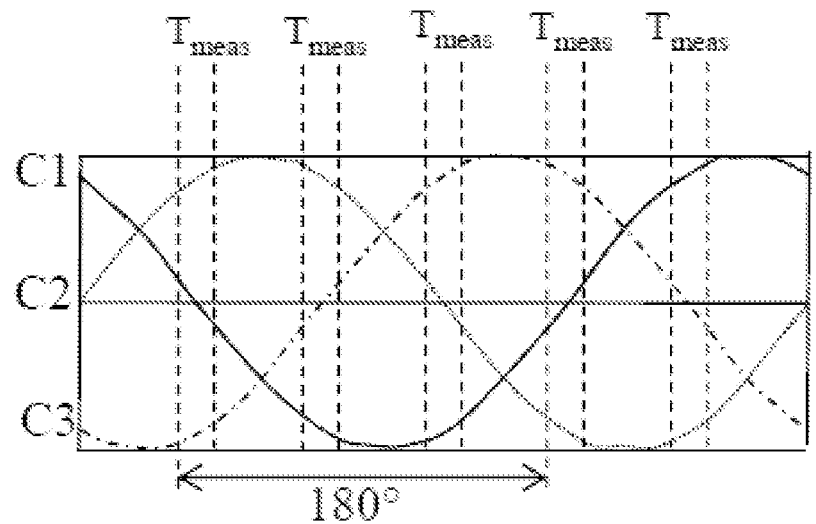
FIG. 4 represents an example of signals provided by the multi-die power module to a load and timings used for determining the temperature and health of one die according to the present invention.

FIG. 4 represents an example of signals provided by the multi-die power module to a load and timings used for determining the temperature and health of one die together according to the present invention.

The signals C1, C2 and C3 provided to the load Mo are shown in FIG. 4.

Certain dies of the multi-die power module 15 are connected in parallel in order to provide a sufficient current to the load Mo. Assuming a load needing with at least two parallel dies, as shown in FIG. 4, each die is driven with a pulse width modulated signal provided by the multi-die health monitoring device 10. During a measurement, one of the parallel dies is held off. In order to reduce the impact of having one parallel die non-operational, the moment in which the measurement current $I_{n,m}$ is injected into one of the parallel dies may occur where one phase current is close to zero, as shown in the regions noted $L_{meas}$. As an example, in a three-phase motor drive system, the valid region for measurement can be +/−15% of the maximum current value around the zero cross of the current.

Figure 5:
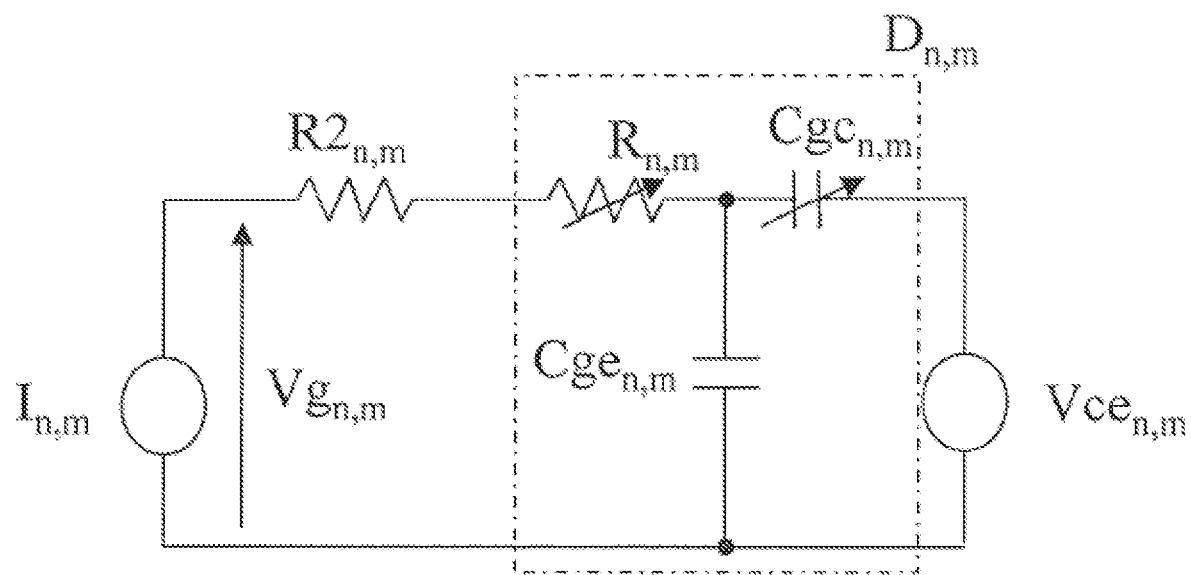
FIG. 5 represents the equivalent circuit of gate current injecting means, voltage measurement and a model of a die according to the present invention.

FIG. 5 represents the equivalent circuit of gate current injecting means, voltage measurement and a model of a die according to the present invention.

The current source $I_{n,m}$ is applied between the emitter of the die $D_{n,m}$ and a first terminal of the gate resistor $R2_{n,m}$.

A second terminal of the resistor $R2_{n,m}$ is connected to a first terminal of the equivalent internal gate resistor $R_{n,m}$ of the die a second terminal of the equivalent internal gate resistor $R_{n,m}$ is connected to a first terminal of a capacitor $Cgc_{n,m}$, between the gate and the collector of the die $D_{n,m}$ and to a first terminal of a capacitor $Cge_{n,m}$, between the gate and the emitter of the die $D_{n,m}$.

A second terminal of the capacitor $Cgc_{n,m}$ is connected to the collector of the die $D_{n,m}$.

A second terminal of the capacitor $Cge_{n,m}$ is connected to the emitter of the die $D_{n,m}$.

During a measurement, the die $D_{n,m}$ is not conducting and all the other dies connected in parallel are conducting. The voltage $Vce_{n,m}$ is the voltage between the collector and the emitter of the die $D_{n,m}$.

When the die $D_{n,m}$ is in off state, i.e. not conducting, the gate of the die can be modelled as an equivalent input capacitor $Cies_{n,m}$ the value of which is equal to $Cies = Cgc_{n,m}$ plus $Cge_{n,m}$. The current $I_{n,m}$ is injected into the gate terminal and the gate voltage begins to increase, corresponding to an accumulation of charge in the equivalent capacitor $Cies_{n,m}$. The voltage at the input of the gate is below the conduction threshold and can be determined after the time $t_{meas}$, according to the following equation:

$$Vg_{n,m}(T, Vce_{n,m}, t_{mes}) \cong I_{n,m} * \left( R2n, m + Rn, m + \frac{t_{mes}}{Cies_{n,m} * (Vce_{n,m})} \right)$$

It can be seen that the gate voltage not only depends on the time spent charging the input capacitance $Cies_{n,m}$, but also on the temperature and collector-emitter voltage $Vce_{n,m}$, of the die $D_{n,m}$. The collector-emitter voltage $Vce_{n,m}$ corresponds to the on-state voltage of the on-state dies connected in parallel.

Specifically, the input capacitance $Cies_{n,m}$ is a function of the collector-emitter voltage, but furthermore, the collector-emitter voltage is itself a function of not only the temperature, but also the collector current as shown by the following equation:

$$Vce(T, I_C) \cong I_C * R_{CE}(T) + Vce, sat(T)$$

where the total series collector and emitter resistance of an IGBT are denoted $R_{CE}$, and the saturation voltage of an IGBT is denoted Vice, sat.

Figure 6:
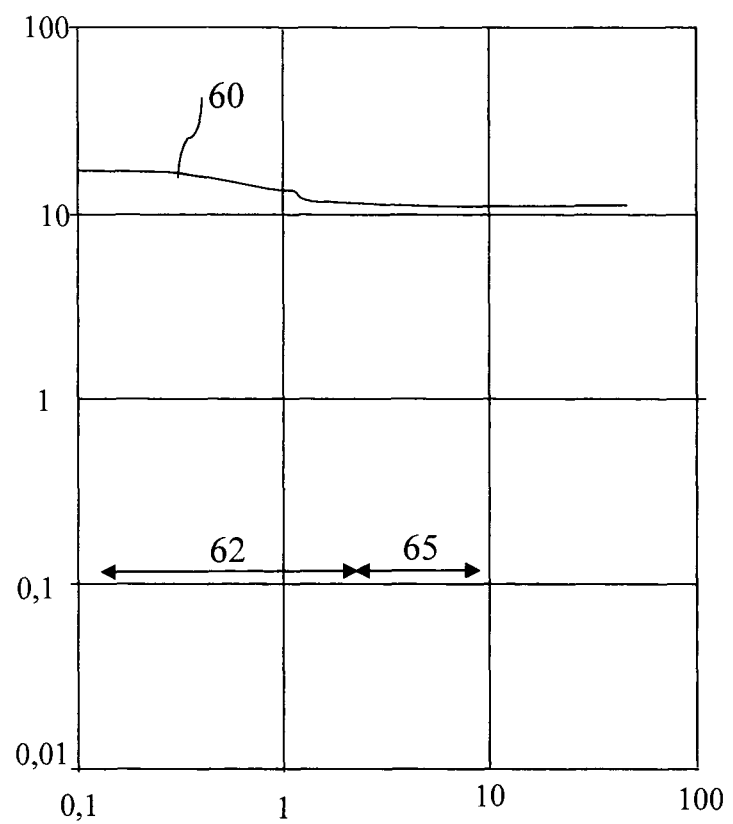
FIG. 6 represents variation of an equivalent input capacitor at the input of the gate of a die.

The relationship between the input capacitance Cies and the collector-emitter voltage is disclosed into the FIG. 6.

FIG. 6 represents variation of an equivalent input capacitor at the input of the gate of a die.

The vertical axis represents the capacitance value in nano Farads and the horizontal axis represents the collector to emitter voltage in Volts.

The curve noted 60 represents the capacitance value of the equivalent capacitor $C_{ies}$.

The curve 60 has two main sections above the saturation voltage Vce,sat. When the gate-collector voltage is significantly higher than the saturation voltage, the dependency of the capacitor $C_{ies}$ on the voltage is low, as shown in the part noted 65. However, when the gate-collector voltage is near or on the same order of magnitude as the saturation voltage, the capacitor $C_{ies}$ value is significantly influenced by the gate-collector voltage as shown in the part noted 62. Because the capacitance $Cgc_{m,n}$ is biased by the $Vce_{mm}$ voltage of the dies in parallel, the voltage $Vg_{n,m}$ evolves differently for different $Vce_{mm}$ values, as it can be seen in FIG. 7, section (a).

Figure 7:
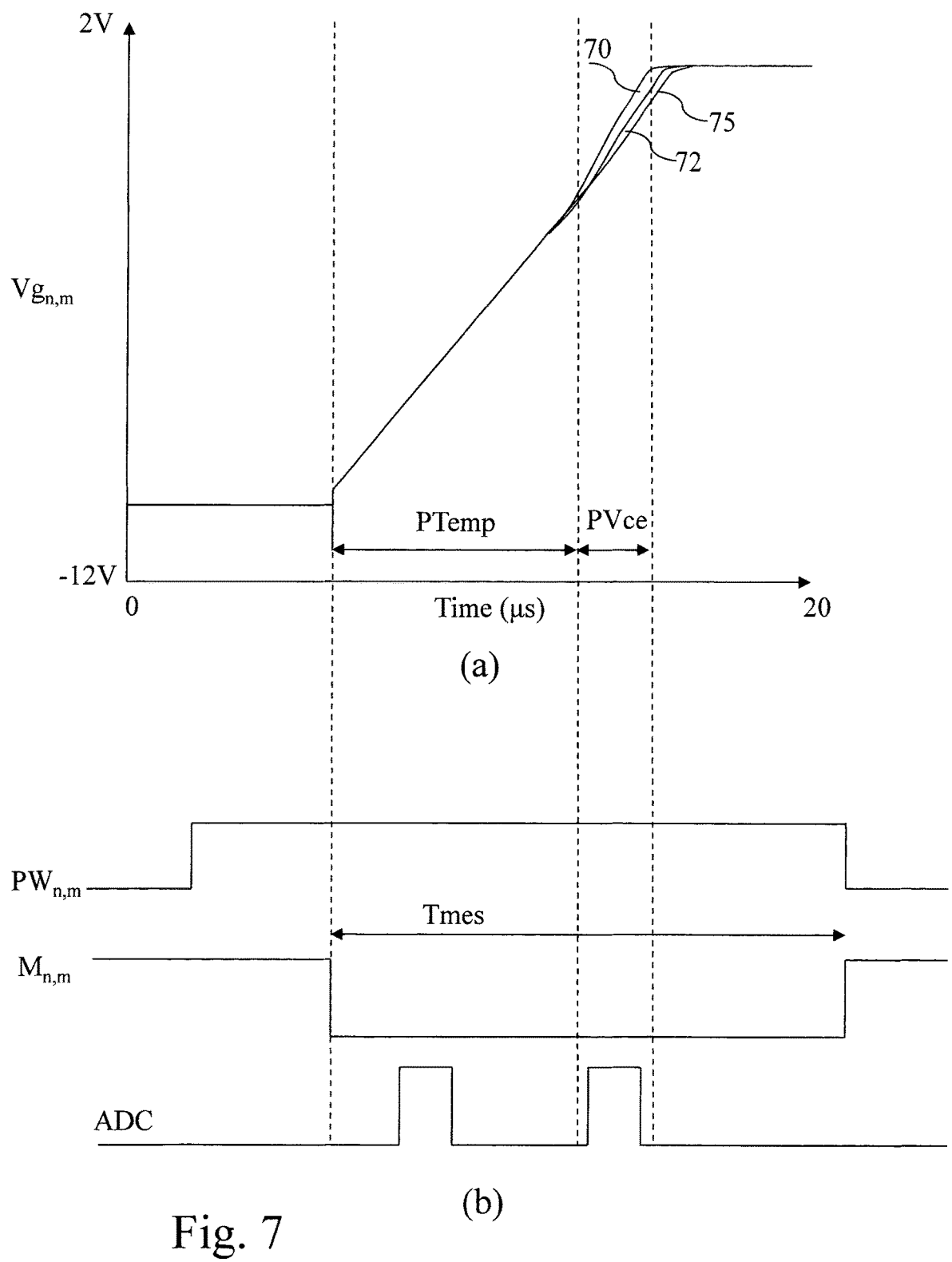
FIG. 7 represents (a) variation of the voltage at the input of the gate of a die when a current is provided to the gate of the die, and (b) an example of chronograms of signals generated by the multi-die health monitoring device for determining the temperature and health of one die according to the present invention.

FIG. 7, section (a) represents variation of the voltage at the input of the gate of a die when a current is provided to the gate of the die according to the present invention.

The horizontal axis represents the time in micro seconds and the vertical axis represents the voltage gate to emitter of the die $D_{n,m}$ in Volts.

The curve noted 70 represents the variation of the voltage gate to emitter of the die $D_{n,m}$ for a collector to emitter voltage of 2 Volts.

The curve noted 72 represents the variation of the voltage gate to emitter of the die $D_{n,m}$ for a collector to emitter voltage of 0.5 Volts.

The curve noted 75 represents the variation of the voltage gate to emitter of the die $D_{n,m}$ for a collector to emitter voltage of 0 Volts.

The present invention exploits such characteristics in order to obtain a signal representative of the temperature of the die $D_{n,m}$ via measurement current injection soon after a given time, such that the measurement occurs during the time period noted PTemp which corresponds to the part 65 in FIG. 6 and, after another defined period of time, in order to obtain a signal representative of the on-state voltage measurement during the time period noted PVce which corresponds to the part 62 in FIG. 6.

FIG. 7, section (b) represents an example of chronograms of signals generated by the multi-die health monitoring device for determining the temperature and health of one die together according to the present invention.

The FIG. 7, section (b) represents the pulse width modulated signal $PW_{n,m}$ and the measurement signals $M_{n,m}$ transferred by the multi-die health controller 10 to the amplifiers including temperature and on-state voltage sensing means $110_{n,m}$.

The multi-die health monitoring device 10 commands by the signal ADC the analogue to digital converter of the first health monitoring module 20a or of the second health monitoring module 20b in order to sample a first time the signal $Vg_{n,m}$ in order to obtain a signal representative of the die $D_{n,m}$ temperature and to sample a second time the signal $Vg_{n,m}$ in order to obtain a signal representative of the die $D_{n,m}$ on-state voltage.

FIG. 8 represents an example of an algorithm for determining the temperature and the health of one die according to the present invention.

The present algorithm is executed by the processor 300 or 350 of the multi-die health monitoring device 10.

The present algorithm will be disclosed in an example wherein it is executed by the processor 300 of the multi-die health monitoring device 10.

At step S900, the processor 300 checks if the current provided to the load Mo by a phase, for example the one of signal C1, is below a predetermined threshold, for example close to zero.

If the current provided to the load Mo by the phase of signal C1 is below the predetermined threshold, the processor 300 moves to step S901 and selects one die $D_{m,n}$ that provides the signal C1 to the load Mo.

At step S901, the processor 300 commands the I/O interface to generate a measurement signal $M_{n,m}$ and waits a predetermined time period $t_1$, which is defined as the minimum setting time for the analogue to digital converter to achieve a stable output, for example half of the duration of PTemp.

At step S902, the processor 300 triggers the analogue to digital converter in order to sample the signal $Vg_{n,m}$ a first time. This voltage may be related to the temperature based on a simple linear relationship between $Vg_{n,m}$ and T, i.e. $Vg_{n,m}(t_1)=k_1*T$, where $k_1$ is a linear coefficient.

At step S903, the processor 300 memorizes the sample.

At step S904, the processor 300 waits a time duration $t_2$ until the time period PVce starts. The start of PVce, can be determined via the following equation:

$$t_2 \cong \frac{Ciesn, m*(V_{part2} - V_{ss})}{I_{n,m}} - t1$$

where $V_{part2}$ is the voltage in region 62 on the input capacitance curve of FIG. 6, selected near the end of the region to maximize the measurement accuracy but safely below the threshold voltage of the die, and Vss is the lowest reference voltage of the power supply of the amplifier 110. Note that the emitter potential is ground, and the supply voltage Vss is below this reference in state of the art gate driver power supplies. As an example, $V_{part2}$ can be selected to be 0.5V if Vss=−5V.

At step S905, the processor 300 triggers the analogue to digital converter to sample the signal $Vg_{n,m}$ a second time. The voltage may be related to the on-state voltage based on a simple linear relationship between $Vg_{n,m}$ and Vce, i.e. $Vg_{n,m}(t_2)=k_2*Vce$, where $k_2$ is a linear coefficient.

At step S906, the processor 300 memorizes the sample.

At step S907, the processor 300 compares the samples stored at steps S903 and S906 to the values of a table stored in the RAM memory 303.

The table comprises plural healthy on-state voltages Vce associated with different temperatures T, defined after the manufacturing of the multi-die power module 15. The table is built by measuring the on-state voltage Vce with respect to the temperature during a calibration phase. As an example, this calibration phase could be performed after the multi-die power module 15 is manufactured by the multi-die power module 15 provider.

Using determined temperature at step S903, the corresponding on-state voltage Vce stored in the table for that temperature is compared to the measured on-state voltage at step S906.

At step S908, the processor 300 checks if the difference between the on-state voltage Vce stored in the table and the measured on-state voltage is equal or upper than 20% of the on-state voltage value stored in the table.

If the difference between the on-state voltage Vce stored in the table and the measured on-state voltage is equal or upper than 20% of the on-state voltage value stored in the table, the processor 300 moves to step S909.

Otherwise, the processor 300 returns to step S900.

At step S909, the processor 300 commands notification means in order to indicate that the multi-die power module has to be replaced.

Naturally, many modifications can be made to the embodiments of the invention described above without departing from the scope of the present invention.

The invention claimed is:

1. A method for controlling the health of a multi-die power module comprising plural dies, a multi-die health monitoring device receiving an input signal and driving the dies of the multi-die power module, at least one group of dies of the multi-die power module providing current to a load, wherein the method is executed by the multi-die health monitoring device and comprises:
    setting, at a given current provided to the load by the group of dies, one die of the group of dies in a non-conducting state,
    obtaining, when the die is in the non-conducting state, a signal that is representative of the temperature of the non-conducting die and determining the temperature of the non-conducting die,
    obtaining, when the die is in the non-conducting state, a signal that is representative of an on-state voltage of the non-conducting die and determining the on-state voltage value of the non-conducting die,
    retrieving in a table stored in a memory of the multi-die health monitoring device, an on-state voltage that corresponds to the given current and the determined temperature of the non-conducting die,
    indicating that the multi-die power module should be replaced, if the difference between the determined on-state voltage value of the non-conducting die and the retrieved on-state voltage is equal or upper than a predetermined value.

2. The method according to claim 1, wherein the predetermined value is equal to twenty percent of the retrieved on-state voltage.

3. The method according to claim 1, wherein the given current value is comprised between +/−15 percents of the peak current value provided to the load.

4. The method according to claim 2, wherein the signal that is representative of the temperature of the non-conducting die and the signal that is representative of the on-state voltage of the non-conducting die are obtained by providing a current to a gate of a FET of the non-conducting die.

5. The method according to claim 4, wherein the signal that is representative of the temperature of the non-conducting die is obtained from a measurement of an internal gate resistor value of a FET of the non-conducting die during a first predetermined time duration and the signal that is representative of the on-state voltage of the non-conducting die is obtained from a measurement of an equivalent capacitor value of the non-conducting die during a second time period following the first time period.

6. The method according to claim 5, wherein the method is executed sequencially for each die of the group of dies.

7. The method according to claim 6, wherein the multi-die power module comprises plural dies and in that the method is executed for each group of dies.

8. A multi-die health monitoring device for controlling the health of a multi-die power module comprising plural dies, the multi-die health monitoring device receiving an input signal and driving the dies of the multi-die power module, at least one group of dies of the multi-die power module providing current to a load, wherein the multi-die health monitoring device comprising processing circuitry:
  to set, at a given current provided to the load by the group of dies, one die of the group of dies in a non-conducting state,
  to obtain, when the die is in the non-conducting state, a signal that is representative of the temperature of the non-conducting die and for determining the temperature of the non-conducting die,
  to obtain, when the die is in the non-conducting state, a signal that is representative of an on-state voltage of the non-conducting die and for determining the on-state voltage value of the non-conducting die,
  to retrieve in a table stored in a memory of the multi-die health monitoring device, an on-state voltage that corresponds to the given current and the determined temperature of the non-conducting die,
  to notify that the multi-die power module has to be replaced, if the difference between the determined on-state voltage value of the non-conducting die and the retrieved on-state voltage is equal or upper than a predetermined value.

9. The multi-die health monitoring device according to claim 8, wherein the predetermined value is equal to twenty percent of the retrieved on-state voltage.

10. The multi-die health monitoring device according to claim 9, wherein the signal that is representative of the temperature of the non-conducting die and the signal that is representative of the on-state voltage of the non-conducting die are obtained by providing a current to a gate of the FET of the non-conducting die.

11. The multi-die health monitoring device according to claim 10, wherein the signal that is representative of the temperature of the non-conducting die is obtained from a measurement of an internal gate resistor value of the FET of the die during a first predetermined time duration and the signal that is representative of the on-state voltage of the non-conducting die is obtained from a measurement of an equivalent capacitor value of the non-conducting die during a second time period following the first time period.

* * * * *